(12) United States Patent
Greco et al.

(10) Patent No.: US 6,221,780 B1
(45) Date of Patent: Apr. 24, 2001

(54) DUAL DAMASCENE FLOWABLE OXIDE INSULATION STRUCTURE AND METALLIC BARRIER

(75) Inventors: Stephen E. Greco, LaGrangeville; John P. Hummel, Millbrook; Joyce Liu, Hopewell Junction; Vincent J. McGahay, Poughkeepsie; Rebecca Mih; Kamalesh Srivastava, both of Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/408,351

(22) Filed: Sep. 29, 1999

(51) Int. Cl.$^7$ ................................................. H01L 21/311
(52) U.S. Cl. .................... 438/702; 438/703; 438/763; 438/778
(58) Field of Search ................... 438/702, 703, 438/763, 778

(56) References Cited

U.S. PATENT DOCUMENTS

| | | | |
|---|---|---|---|
| 5,085,893 | 2/1992 | Weiss et al. | 427/387 |
| 5,087,591 | 2/1992 | Teng | 437/225 |
| 5,530,293 | 6/1996 | Cohen et al. | 257/752 |
| 5,612,254 | * 3/1997 | Mu et al. | 437/195 |
| 5,656,543 | 8/1997 | Chung | 438/625 |
| 5,661,344 | 8/1997 | Havemann et al. | 257/758 |
| 5,668,054 | * 9/1997 | Sun et al. | 438/653 |
| 5,705,430 | 1/1998 | Avanzino et al. | 437/195 |
| 5,714,418 | 2/1998 | Bai et al. | 438/627 |
| 5,821,162 | 10/1998 | Yamaha et al. | 438/623 |
| 5,854,101 | * 12/1998 | Wu | 438/231 |

\* cited by examiner

Primary Examiner—Richard Booth
Assistant Examiner—Alexander G. Ghyka
(74) Attorney, Agent, or Firm—McGuireWoods, LLP; Joseph P. Abate, Esq.

(57) ABSTRACT

A method and structure for protecting a flowable oxide insulator in a semiconductor by oxidizing sidewalls of the FOX insulator, optionally nitridizing the oxidized FOX sidewalls, and then covering all surfaces of a trough or plurality of troughs in the FOX insulator, including the sidewalls, with a conductive secondary protective layer. In a multiple layer damascene structure, the surface of the FOX insulator is also oxidized, an additional oxide layer is deposited thereon, and a nitride layer deposited on the oxide layer. Then steps are repeated to obtain a comparable damascene structure. The materials can vary and each damascene layer may be either a single damascene or a dual damascene layer.

26 Claims, 12 Drawing Sheets

DUAL DAMASCENE FLOWABLE OXIDE INSULATION STRUCTURE AND METALLIC BARRIER

CROSS-REFERENCE TO RELATED APPLICATIONS

This application is related to U.S. patent application Ser. No. 09/311,470, filed May 13, 1999 for an "INTERIM OXIDATION OF SILSESQUIOXANE DIELECTRIC FOR DUAL DAMASCENE PROCESS" by Robert Cook et al., assigned to the same assignee as the present invention, International Business Machines Corp. (IBM), and is hereby fully incorporated by reference.

BACKGROUND OF THE INVENTION

1. Field of the Invention

The present invention generally relates to integrated circuit manufacturing and, more particularly, to the use of flowable oxide (FOX) layers as insulators or barriers for semiconductor devices and the protection of FOX layers from degradation in such applications.

2. Description of the Prior Art

Increases in both performance and manufacturing economy with increased integration density have led to the use of design rules with extremely small feature sizes and closeness of spacing in integrated circuit design. Reduced interconnection length between devices included in integrated circuits generally reduces signal propagation time and increases noise immunity. However, as integrated circuits are scaled to smaller design rules, reductions in wiring delays are diminished by increases in resistance (due to decreased cross-sectional area) and capacitance (due to increased connection proximity). This effect can only be ameliorated by reduced resistivity of conductors and/or dielectric constant of insulators. Accordingly, advanced dielectric materials having low dielectric constants have been developed and are used in manufacture of integrated circuits.

Flowable oxides (FOXs) are one family of low dielectric constant materials developed for use in the manufacture of integrated circuits. FOX insulators have good gapfill properties. These materials form a structure in which bridging oxygen atoms are shared between molecules. While the dielectric constant is low, the bridging oxygen atoms are strained and can be attacked by numerous chemicals or result in rapidly propagating cracks from relatively minor physical damage. For that reason, unprotected FOX materials are not generally considered suitable for formation of layers even though they exhibit good planarizing characteristics that would support high resolution lithographic processes.

Damascene processing is a well-understood and mature technology which is particularly useful for mechanically forming robust connections of superior electrical integrity at very small sizes and close spacings. Basically, a Damascene process defines the desired shape of conductors by the formation of a groove or recess in the surface of a dielectric material followed by deposition of a layer of metal of sufficient thickness to fill the recesses. The layer of metal is then readily patterned by planarization to the original surface of the dielectric by any known process such as polishing. The structure so formed fully supports the metal at the bottom and sides of a connection (which may be made of soft materials such as gold, aluminum or copper or other materials such as tungsten) and thus is resistant to metal migration, damage or the like. The groove or recess can also generally be formed with greater precision and regularity of the edges of the pattern than can be achieved by direct patterning of a layer of metal.

When forming damascene conductors on a dielectric layer above a substantially completed chip, however, two patterning processes are required for formation of the interconnect patterns and for forming connections to devices on the chip in the form of vias, respectively. These two patterning processes followed by metal deposition and planarization are collectively referred to as a dual Damascene process.

However, most FOX materials are readily attacked by most lithographic resist developers which are generally of high pH. Moreover, when the FOX material is attacked by resist developers, the amount of material which may be removed is not readily controllable and may undercut the resist pattern. Thus, when the FOX is etched, even with a well-controlled etchant, the resulting via shape may be quite distorted and vias will lack uniformity across the chip and possibly be irregularly and unreliably registered with the structures on the chip to which the vias are to form connections. Moisture is similarly damaging to FOX materials.

Therefore, the surface of a FOX material needs to be protected with a further layer of material. One approach to the protection of a FOX layer in a semiconductor is the TaN/Ta system. However, TaN barriers may have very small pinholes exposing the FOX to a metallic conductor, typically copper. Such systems are known as extrudable systems because the metallic conductor, when heated or otherwise under pressure, will seek to extrude into surrounding materials. Unfortunately, this exposure causes other reliability problems associated with the extrusion of the metallic conductor into the FOX or corrosion of the metallic conductor or both. For example, when the conductive paths in an integrated circuit chip are at close pitch, even a very small amount of copper extrusion through a pinhole defect can cause a short circuit between one copper interconnect line and a second copper interconnect line. Furthermore, some materials that may be otherwise desirable for metallization layers will not adhere to FOX materials. U.S. Pat. No. 5,530,293, issued to Cohen et al. on Jun. 25, 1996 (Cohen), describes a method of capping FOX material with 1000 Å of $SiO_2$ by plasma enhanced chemical vapor deposition (PECVD) or low plasma chemical vapor deposition (LPCVD) to increase adhesion.

Protection of the surface of the FOX material with a further layer of material such as another dielectric is not practical in some semiconductor structures such as formation of connection vias in a dual Damascene process. Virtually any otherwise suitable material for protection of a FOX material would have a dielectric constant which is higher than that of the FOX and even a very thin layer would increase capacitance at a location where capacitance may be critical and may possibly require a different etchant and/or an additional etching process to remove in accordance with a resist pattern. Additionally, while a protective layer may be deposited on an original surface of a FOX layer, deposition of a protective layer in an etched feature (e.g. in a trench or groove) would require additional process steps as well as compromising the low capacitance of any conductive structure formed therein for which the FOX material was employed.

The basic concept of using a resist is predicated on the assumption that the underlying material will not be affected by the processing and development of the resist until the resist pattern is fully formed. Since the FOX material removal by the resist developer appears to be a function of the breaking of fragile shared oxygen bonds, it is unlikely that a developer could be found which would not attack the FOX material. Accordingly, at the present state of the art, processes using multiple resist layers would provide no significant benefit toward reduction of the problem.

It is known to protect a FOX with a higher quality oxide. However known methods generally focus on the use of a separate oxide film to accomplish this objective. Furthermore, U.S. Pat. No. 5,085,893, issued to Keith D. Weiss et al. on Feb. 4, 1992 for a "PROCESS FOR FORMING A COATING ON A SUBSTRATE USING A SILSESQUIOXANE RESIN", teaches that a FOX can be converted to a high quality ceramic through oxidizing the FOX. However, the dielectric constant of the volume of FOX material converted to oxide is increased which increases the capacitance. Similarly, the provision of a separate protective layer of another material would significantly alter the average dielectric constant and potentially introduce adhesion problems. Thus, there is a need for a very thin protective barrier which cannot be formed by previously known methods.

In summary, use of a FOX material to underlie or support interconnection metallization allows the use of damascene processes to produce conductors and vias only with the likelihood that manufacturing yield will be compromised. While FOX materials can be used as a gap fill material over connections applied to a surface the advantages of damascene connections noted above are not achieved thereby. No technique has been available for avoiding the basic incompatibility of FOX materials and resist developers in processes requiring a sequence of patterned etch steps, such as in a dual damascene process, particularly for accommodating fine pitch design rules for high density integrated circuits where the low dielectric constant of FOX materials is particularly critical.

SUMMARY OF THE INVENTION

It is therefore an object of the present invention to provide a process by which robust interconnections between devices on a chip can be formed through a damascene process consistent with the use of a FOX dielectric material and high manufacturing yield.

It is also an object of the present invention to protect the surfaces of a FOX from processing steps and materials that degrade the FOX during the fabrication of semiconductor devices.

A related object of the present invention is to maintain as much FOX insulation as possible in the structure of a semiconductor device at all times during the fabrication of the device.

Another related object of the present invention is to provide a substantially impermeable barrier between a FOX and the metallic conductor in a semiconductor device.

A like object of the present invention is to provide a barrier isolating a FOX from moisture in a semiconductor device.

A similar object of the present invention is to provide a barrier improving the function of a secondary metallic barrier.

A further object of the present invention is to increase the adhesion between a FOX and a material deposited on the FOX during the fabrication of a semiconductor device.

Yet another related object of the present invention is to provide a very thin protective barrier formed by oxidizing an oxide.

In order to accomplish these and other objects of the invention, a method is provided for protecting a flowable oxide insulator in a semiconductor by oxidizing sidewalls of the FOX insulator, optionally nitridizing the oxidized FOX sidewalls, and then covering all surfaces of a trough or plurality of troughs in the FOX insulator, including the sidewalls, with a conductive secondary protective layer. In a multiple layer damascene structure, the surface of the FOX insulator is also oxidized, an additional oxide layer is deposited thereon, and a nitride layer deposited on the oxide layer. These steps are then repeated to obtain a comparable damascene structure. The materials can vary and each damascene layer may be either a single damascene or a dual damascene layer.

BRIEF DESCRIPTION OF THE DRAWINGS

The foregoing and other objects, aspects and advantages will be better understood from the following detailed description of a preferred embodiment of the invention with reference to the drawinqs, in which.

DETAILED DESCRIPTION OF A PREFERRED EMBODIMENT OF THE INVENTION

Figure 1:
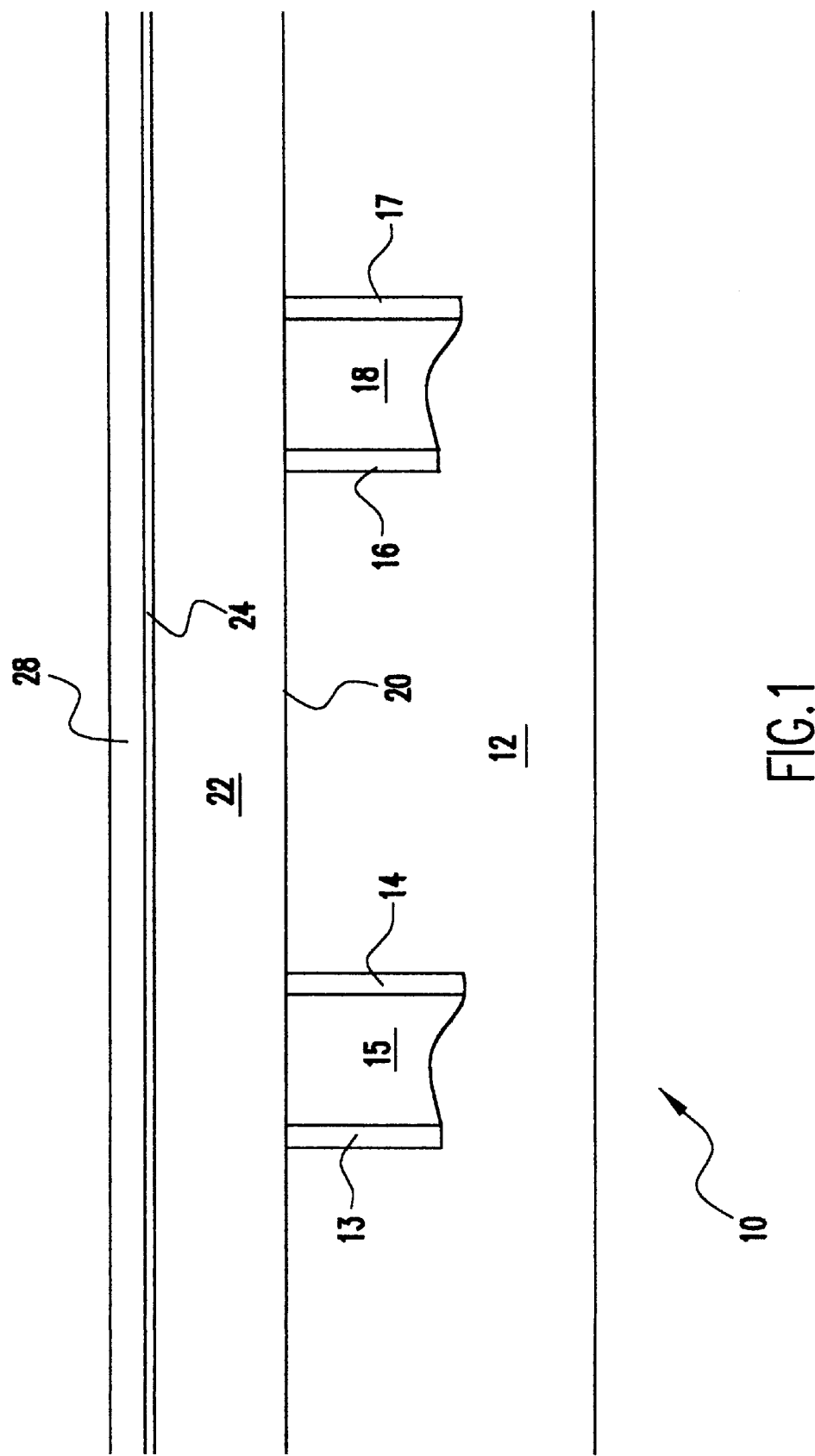
FIG. 1 is a cross-sectional view of an exemplary portion of a substrate with three layers formed thereon according to the first damascene process of the present invention.

Referring now to FIG. 1, there is shown a cross-sectional view of an integrated circuit chip 10 having devices such as transistors, capacitors and underlying connections (not shown) formed thereon. At the bottom of the circuit chip is a substrate 12. The substrate is formed of Boron Phospho-Silicate Glass (BPSG) or Phospho-Silicate Glass (PSG). The substrate 12 defines exemplary stud walls 13 and 14 of a first stud 15 and stud walls 16 and 17 of a second stud 18. The studs are in communication with the underlying electrical connections. The number and location of the studs are determined as a matter of integrated circuit design and are unimportant to the practice of the invention in accordance with its basic principles. After a stud or plurality of studs are formed, a substrate surface 20 of the substrate 12 is planarized by a known method such as polishing, however other methods suitable to planarize a surface of a substrate can also be used.

After the substrate surface 20 has been planarized, a first flowable oxide (FOX) insulator layer 22 of dielectric material is deposited thereon. The deposition of the first FOX insulator layer 22 can be accomplished by well known spin-apply methods. Afterward, the first FOX insulator layer 22 is annealed and cured in a manner known in the art. For example, it is well known to cure a flowable oxide in either hydrogen ($H_2$) or nitrogen ($N_2$)

Next, the first FOX insulator layer 22 is oxidized. This step creates a first oxidized FOX layer 24. An oxygen ($O_2$) plasma treatment is used to oxidize the surface of the first FOX insulator layer 22. A very thin layer of about 200 to 300 angstroms has been found to be suitable for the first oxidized FOX layer 24.

This oxidizing of an oxide, results in many unexpected benefits. First, as will be seen, it protects the unoxidized first FOX insulator layer 22 from being attacked by subsequent processing agents such as lithographic resist developers. Oxidizing the first FOX insulator layer 22 also creates a robust moisture resistant barrier on the surface of the first FOX insulator layer 22. Further, were extrusion a concern in the structure here, the first oxidized FOX layer 24 would not be susceptible to pinholes compromising its structural or electrical integrity and the resultant problems previously discussed. Also, the first oxidized FOX layer 24 formed in this manner provides a surface to which the lithographic resist and subsequent metals used in the damascene process will adhere. This particular benefit will become more apparent below. Further, by keeping the first oxidized FOX layer 24 very thin, the overall dielectric constant of the material is kept low. For this reason, it is recommended that the first oxidized FOX layer 24 be less than 500 Angstroms thick or about 20% or less of the FOX thickness to limit increase in the dielectric constant. In this manner, the first oxidized FOX layer 24 overcomes several problems associated with the first FOX insulator layer 22 and treatments thereof.

After the planarized substrate 12, the first FOX insulator layer 22, and the first oxidized FOX layer 24 have been formed, a first oxide layer 28 is formed. To produce the first oxide layer 28, low plasma chemical vapor deposition oxide (LPCVD $SiO_2$) is formed to a thickness of about 1000 Angstroms as described in U.S. Pat. No. 5,530,293, issued to Stephan A. Cohen et al. on Jun. 25, 1996 for a "CARBON-FREE HYDROGEN SILSESQUIOXANE WITH DIELECTRIC CONSTANT LESS THAN 3.2 ANNEALED IN HYDROGEN FOR INTEGRATED CIRCUITS". Having prepared the first FOX insulator layer 22 to receive the first oxide layer 28 by forming the first oxidized FOX layer 24, the first oxide layer 28 will easily adhere to the presented surface of the first oxidized FOX layer 24.

The first oxide layer 28 represents a planar surface covering and protects the first FOX insulator layer 22 below.

Consequently, lithographic resist may be applied, exposed and developed on the first oxide layer 28 in the next step of the present invention without attacking the first FOX insulator layer 22.

Figure 2:
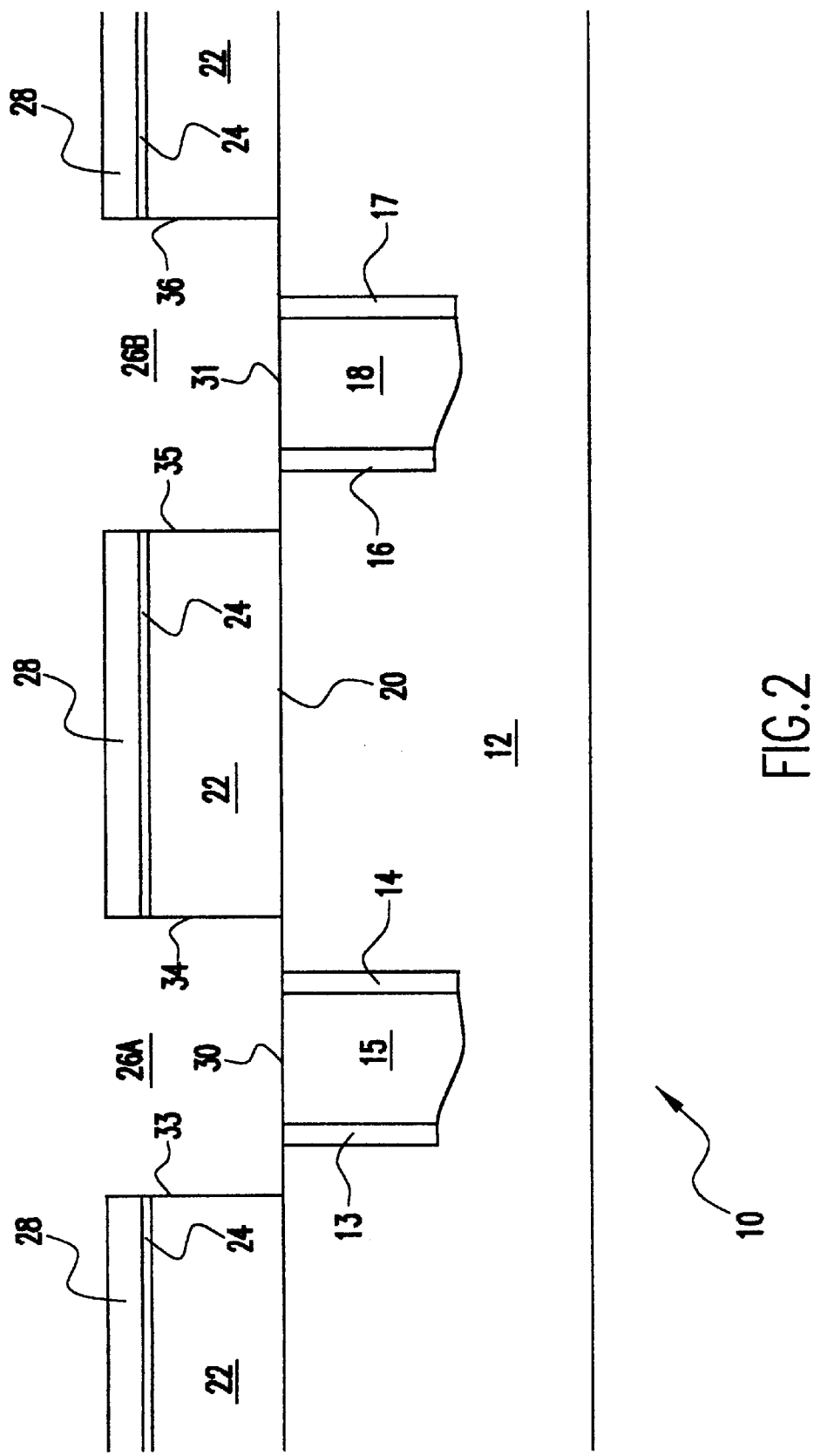
FIG. 2 is a cross-sectional view of the exemplary portion shown in FIG. 1 further showing a pair of troughs etched in the first damascene layer according to the present invention.

At this point in the process of the present invention, four planar layers have been formed, the substrate 12, the first FOX insulator layer 22, the first oxidized FOX layer 24, and the first oxide layer 28. Referring now to FIG. 2, in the next step of the present invention, first conductor troughs 26a and 26b are formed by a process of applying, patterning, exposing and developing lithographic resist on the first oxide layer 28 thus dry etching through the first oxide layer 28, the first oxidized FOX layer 24, and the first FOX insulator layer 22 according to a process described in U.S. patent application Ser. No. 09/311,470, filed May 13, 1999 for an "INTERIM OXIDATION OF SILSESQUIOXANE DIELECTRIC FOR DUAL DAMASCENE PROCESS" by Robert Cook et al., and incorporated herein by reference. The particular method of etching employed is not critical to the present invention and other methods of etching known in the art may be substituted for the dry etching method suggested. Regardless of the etching method selected, the process of etching to form the first conductor troughs 26a and 26b should continue until the etching has passed through the first oxide layer 28, the first oxidized FOX layer 24, and the first FOX insulator layer 22, thus exposing a first contact area 30 at the top of stud 15, a first contact area 31 at the top of stud 18, and layer 12 within the troughs 26a and 26b.

In this process step, care should be taken when removing the resist. Although it must be assured that all of the resist is removed, some of the exposed portions of the first FOX insulator layer 22 will be converted to oxide in the process. Although the exposed portions of the first FOX insulator layer 22 will eventually be oxidized, in order to achieve greater control of the oxidation of the exposed portions of the first FOX insulator layer 22 it is preferred that this oxidation be performed in a separate process step. Thus, when removing the resist, care should be taken to convert as little of the first FOX insulator layer 22 as possible, while assuring that all of the resist is removed.

An oxygen plasma can be used to remove the resist. In this process, it is beneficial to control the plasma conditions by the amount of time of exposure of the first FOX insulator layer 22 to the O2 plasma.

Figure 11:
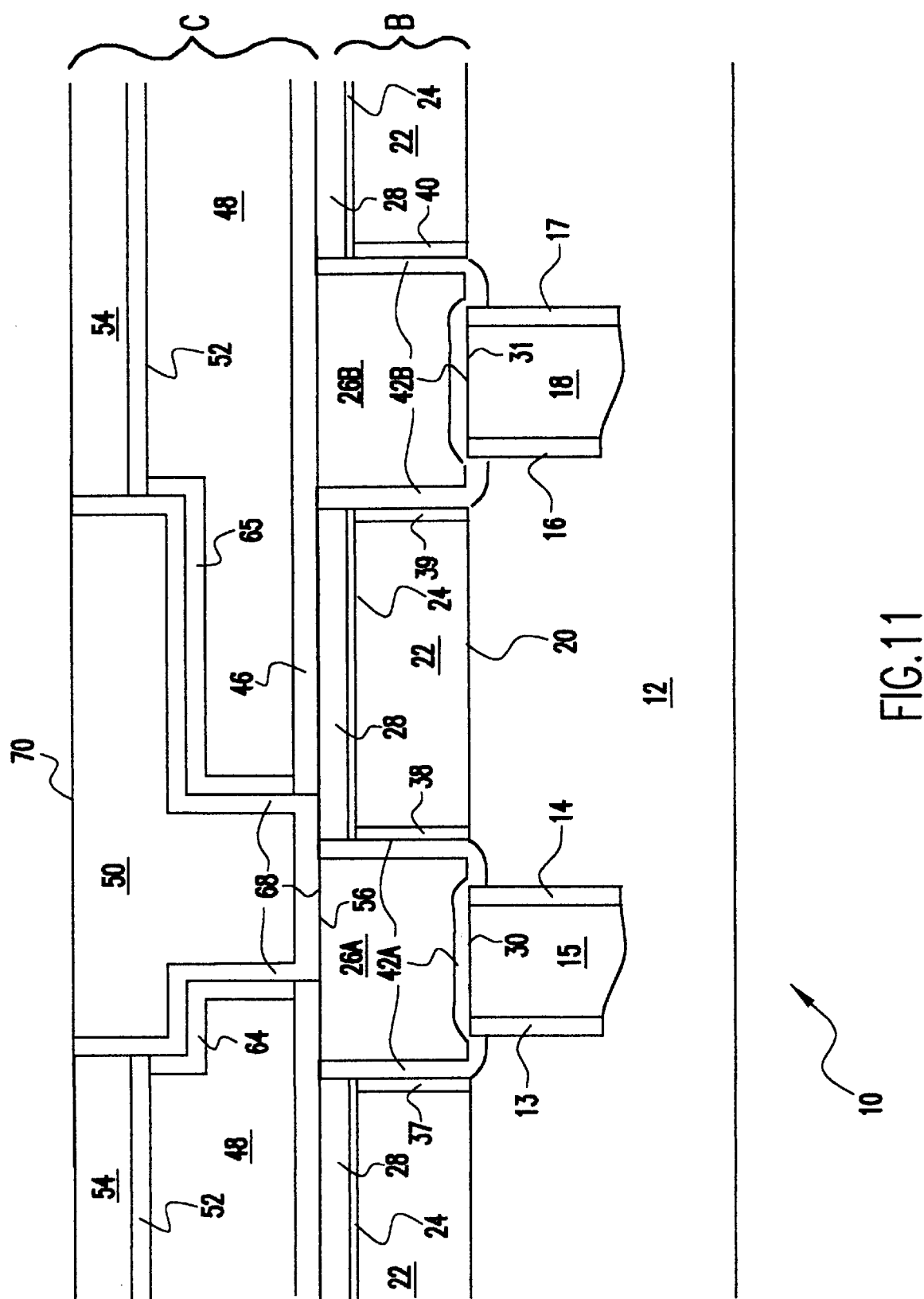
FIG. 11 is a cross-sectional view of an exemplary portion of an exposed and developed conductive line resist pattern on an etched insulating layer according to the dual damascene process of the present invention.

FIG. 11 depicts the integrated circuit chip 10 of the present invention after all of the steps in the process of the present invention have been completed. The first FOX insulator layer 22 substantially defines first conductor troughs 26a and 26b. An extrudable metal system will be located in the troughs 26a, 26b. The extrudable metal system is susceptible to corrosion when exposed to moisture. A thickness of about 2200 Angstroms is considered generally adequate to enable the first FOX insulator layer 22 to host the metal system of the first conductor troughs 26a and 26b. The number, location, geometry and dimensions of the conductor troughs are determined as a matter of integrated circuit design and are unimportant to the practice of the present invention in accordance with its basic principles.

Figure 3:
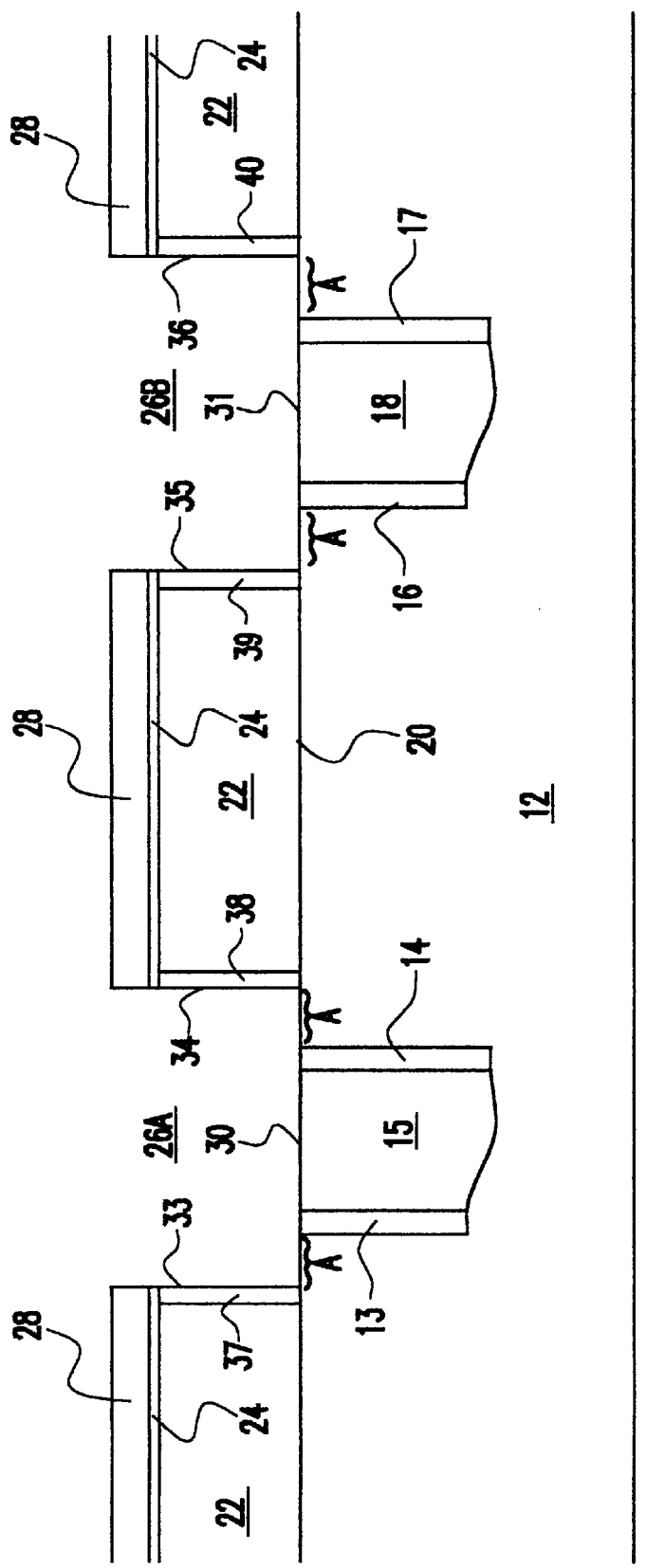
FIG. 3 is a cross-sectional view of the exemplary portion shown in FIG. 2 further showing oxidized sidewalls of the first damascene layer according to the present invention.

Referring now to FIG. 3, the next step of the present invention is that the first sidewalls 33–36 are oxidized according to the same procedure described above for the formation of the first oxidized FOX layer 24. This step creates first oxidized sidewalls 37–40. The benefits obtained from first oxidized sidewalls 37–40 are the same as the unexpected benefits described above in connection with the first oxidized FOX layer 24. In the preferred embodiment, the first sidewalls are oxidized by O2 plasma to roughly 250 Angstroms to form the first oxidized sidewalls 37–40. And, as with the first oxidized FOX layer 24, it is recommended that the first oxidized sidewalls 37–40 be less than 500 Angstroms thick in order to maximize the benefits obtained therefrom for the reasons indicated above. The first oxidized sidewalls operate as the primary barrier against moisture and copper extrusion.

It should be noted that a protective layer will also be formed on the first FOX layer 22 by reactive ion etching with fluorocarbon gases (RIE). Since those of skill in the art often etch a trench such as the conductor troughs 26a and 26b by a fluorocarbon RIE, it should be apparent that the first oxidized sidewalls 37–40 may be formed during etching of the conductor troughs 26a and 26b. However, as previously mentioned, it is preferred to form the first oxidized sidewalls 37–40 in a separate step because a greater degree of control is thus obtained. If the first oxidized sidewalls 3740 are formed during the RIE, it is believed that lesser control would result in an alteration of the profile of the first sidewalls 33–36 due to the removal of some of the material in the first FOX insulator layer 22.

Additionally, after their formation, the first oxidized sidewalls 37–40 may be nitridized. This step is optional. The resulting nitridized layer acts as a supplemental protective layer. When this optional step is performed, the layers depicted by reference numbers 37–40 may be considered to represent a multi-layer structure containing the optional nitridized layer and the oxidized layer, or an oxynitride layer. $NH_3$ or $N_2$ plasma may be used to nitridize the oxidized sidewalls in this optional step. Other suitable nitridizing substances and techniques may also be used to nitridize the oxidized sidewalls. The nitridized layer acts as a supplementary barrier and the first oxidized sidewalls operate as a primary barrier against copper extrusion and the previously mentioned problems associated therewith. Another benefit of nitridizing the first oxidized sidewalls 37–40 is that a conductor such as copper will more readily adhere to the resulting surface when deposited in the conductor troughs 26a and 26b.

Since the oxidation procedure described for the first oxidized FOX layer 24 and the first oxidized sidewalls 37–40 is designed to isolate the first FOX insulator layer 22 from exposure to moisture and extrusion from the metallic conductor, it is not necessary to oxidize the substrate surface 20 within the first conductor troughs 26a and 26b, an area indicated by brackets A. Consequently, the substrate surface 20 is left exposed within the first conductor troughs 26a and 26b at brackets A after the formation of the first oxidized sidewalls 37–40.

Furthermore, the next step requires the electrical connection at first contact areas 30, 31 to be precleaned. Of course, in order to preclean the first contact areas 30, 31, they must remain exposed after the formation of the first oxidized sidewalls 37–40.

Naturally, a minor amount of oxidation of the surface of the studs 15, 18 and the substrate 12 within the troughs 26a and 26b will take place when the first oxidized sidewalls 37–40 are formed. The oxidation of the surfaces in the bottom of the troughs 26a and 26b is removed by a directional argon sputter clean or comparable directional clean. A directional clean as known in the art will remove any oxidation on the surfaces at the bottom of the troughs 26a and 26b without removing an appreciable amount of the oxidized sidewalls 37–40. Alternatively, since the materials on the bottom surfaces of the troughs 26a and 26b are not the same as the materials of the sidewalls 37–40, the small amount of oxide on the bottom surfaces of the troughs 26a and 26b could be removed by an omnidirectional wet clean that reacts only with Tungsten oxide or the other materials on the bottom surfaces of the troughs 26a and 26b.

Figure 4:
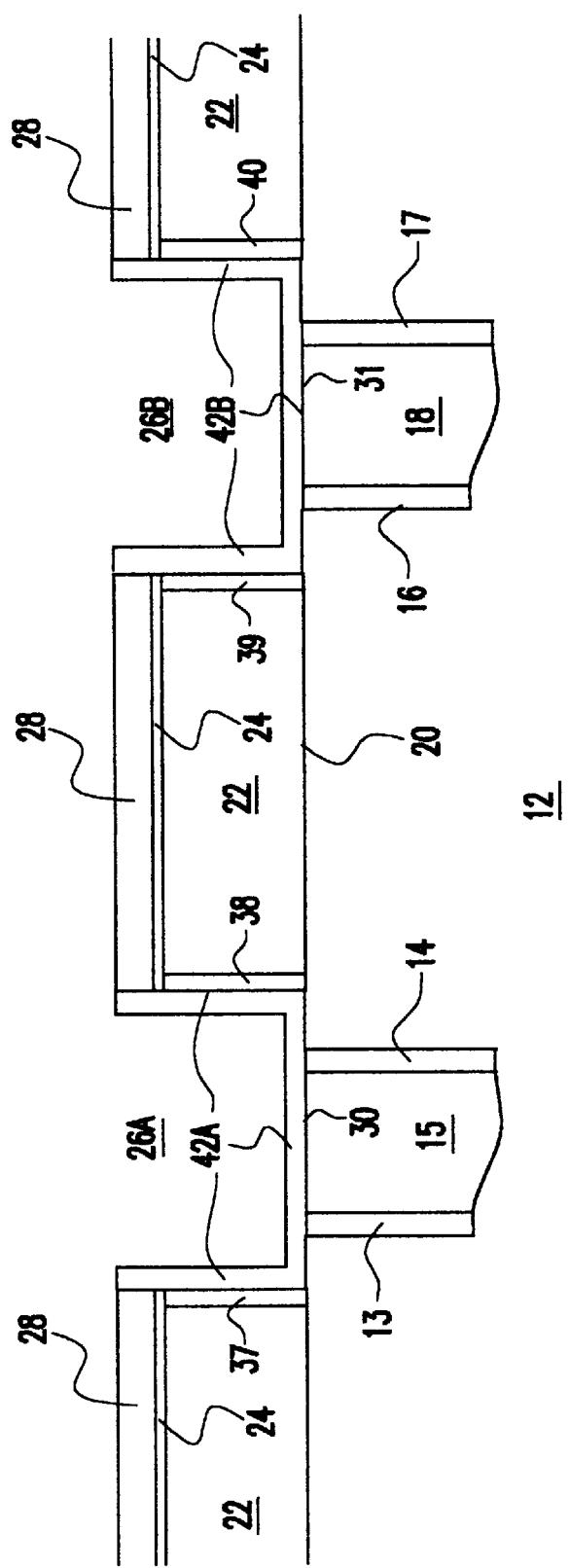
FIG. 4 is a cross-sectional view of the exemplary portion shown in FIG. 3 further showing an extrusion barrier of the first damascene layer according to the present invention.
Figure 5:
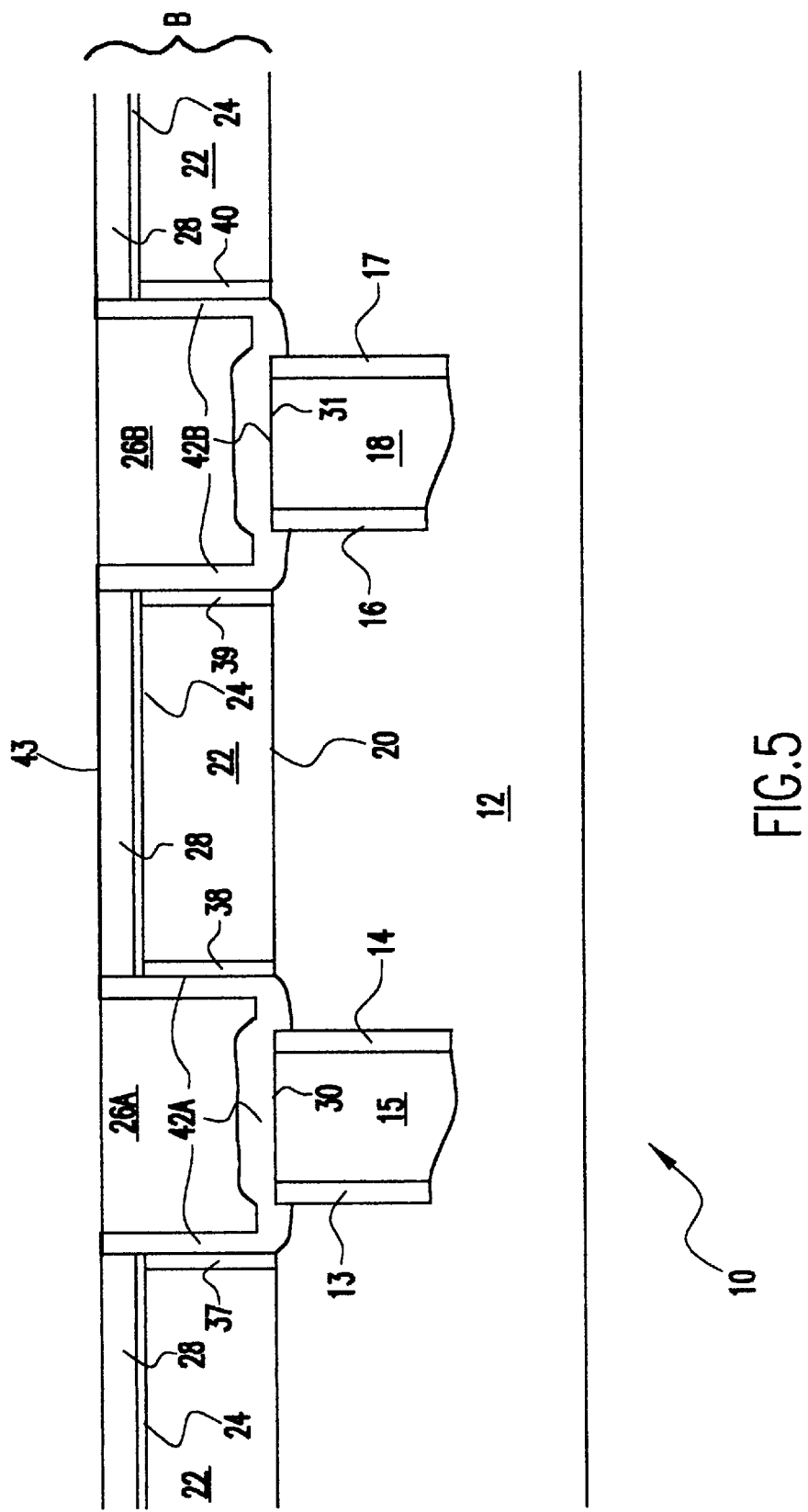
FIG. 5 is a cross-sectional view of an exemplary portion of an exposed and developed conductive line resist pattern on an etched insulating layer according to the first damascene process of the present invention.

Referring now to FIG. 4, after precleaning the first contact areas 30, 31, a first extrusion barrier 42a is formed throughout the first conductor trough 26a and a first extrusion barrier 42b is formed throughout the first conductor trough 26b. The first extrusion barriers 42a and 42b operate as a secondary protective layer isolating the first FOX insulator layer 22 from moisture and copper extrusion. The first extrusion barriers 42a and 42b cover not only the first oxidized sidewalls 37–40, but also the first contact areas 30, 31 and the portion of the substrate surface 20 exposed within the first conductor troughs 26a and 26b at brackets It should be noted that, in practice, it is often necessary to conduct an overetch of the substrate 12 to insure a good electrical contact with the studs 15 and 18. Such an overetch would result in a minor erosion of the portion of the substrate surface 20 exposed within the first conductor troughs 26a and 26b at brackets A. This erosion, shown in the FIG. 5, causes the studs 15 and IS to extend slightly into the first conductor troughs 26a and 26b after the overetch.

By covering the first contact areas 30, 31 and the exposed portions of the substrate surface 20, the first extrusion barriers 42a and 42b differ in geometry from the first oxidized sidewalls 37–40 in that the first extrusion barriers 42a and 42b form a continuous, unbroken protective layer within the first conductive troughs 26a and 26b. In contrast, the first oxidized sidewalls 37–40 form a discontinuous protective layer only on the first sidewalls 33–36 of the first FOX insulator layer 22, but not on the first contact areas 30, 31 or the substrate surface 20.

The first extrusion barriers 42a and 42b are preferably formed of tantalum, tantalum nitride or a combination thereof. It is not critical that the extrusion barriers 42a and 42b be formed of TaN/Ta. Any suitably electrically conductive material and suitable method for forming a secondary barrier against moisture and against extrusion from a conductor used in an integrated circuit chip can be employed.

In the past, an extrusion barrier like the first extrusion barriers 42a and 42b has been used as a primary barrier against moisture and extrusion. However, these barriers have not always been effective for various reasons such as pinhole defects. Thus, the present invention incorporates the use of both a secondary and a primary barrier isolating a FOX insulation layer from moisture and from copper extrusion. Therefore, if the material used to fabricate the secondary first extrusion barriers 42a and 42b is subject to pinhole defects, as is the case with TaN/Ta extrusion barriers, the presence of such defects are not necessarily fatal to the operation or deleterious to the manufacturing yield of an integrated circuit chip employing the primary extrusion barrier(s) of the present invention.

After the first secondary extrusion barriers 42a and 42b are formed, a first conductor is deposited in the first conductor troughs 26a and 26b. Typically the first conductor is Copper (Cu). once the first conductor has been deposited, the entire surface is planarized by polishing or other smoothing techniques for forming a planar surface on an integrated circuit chip familiar to those skilled in the art. Since the first oxide layer 28 is the topmost layer outside of the first conductor troughs 26a and 26b at this stage in the process, the first conductor in the first conductor troughs 26a and 26b is polished until it is even with the surface of the first oxide layer 28. The first oxide layer 28 is a robust polish stop. Thus, after polishing, the tops of the first conductors in the first conductor troughs 26a and 26b and first oxide layer 28 form a continuous planar surface 43.

Figure 6:
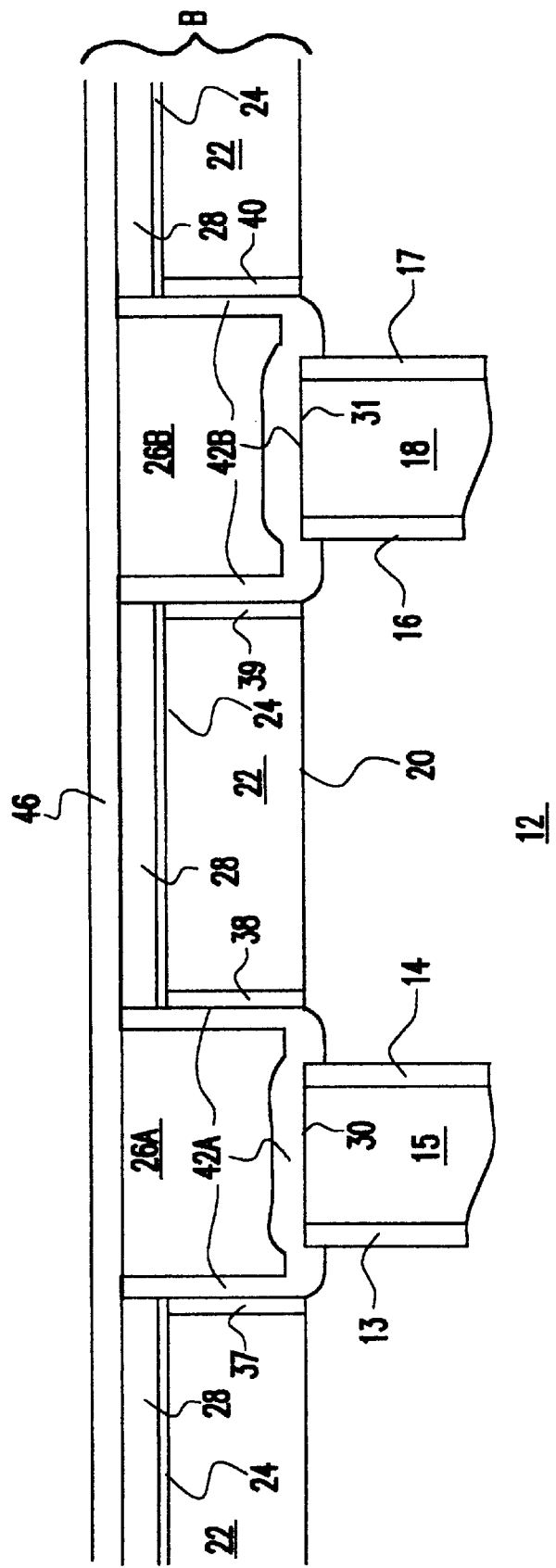
FIG. 6 is a cross-sectional view of the exemplary portion shown in FIG. 5 further showing the addition of a nitride layer according to the dual damascene process of the present invention.

At this point, a first damascene process is complete. Bracket B indicates a first damascene layer formed by the first damascene process. Before the beginning of a second damascene process, a nitride layer 46 is formed as shown in FIG. 6. The nitride layer 46 is formed by depositing nitride according to any of several methods known in the art. The nitride layer 46 acts as a barrier over the first conductor in the first conductor troughs 26a and 26b prior to the commencement of the second damascene process.

The steps in the process described to this point are the steps of a first damascene process. After the formation of the nitride layer 46, the steps of depositing a FOX layer through depositing a conductor in the conductor trough(s) and planarizing the whole surface are repeated. The repeated steps are the steps of a second damascene process and form a second damascene layer, represented by bracket C in FIGS. 8 through 11.

Although little of substance differs between the steps of the first damascene process previously described and the steps of the second damascene process necessary to form the second damascene layer C, the steps of the second damascene process will nonetheless be specifically mentioned in the interest of clarity and completeness. Further, either the first damascene layer B or the second damascene layer C or any subsequent layer could be either a single or dual damascene layer, and an exemplary dual damascene layer will be described to fully enable practice of the invention in all its variations.

Generally the materials used in equivalent steps from the first damascene process and the second damascene process will be the same. However, it is not essential to the practice of the present invention that the material used in a corresponding step from the second damascene process be the same as the material used in the corresponding step from the first damascene process. Thus, the material composition of the various elements of the present invention may be varied as desired.

Figure 7:
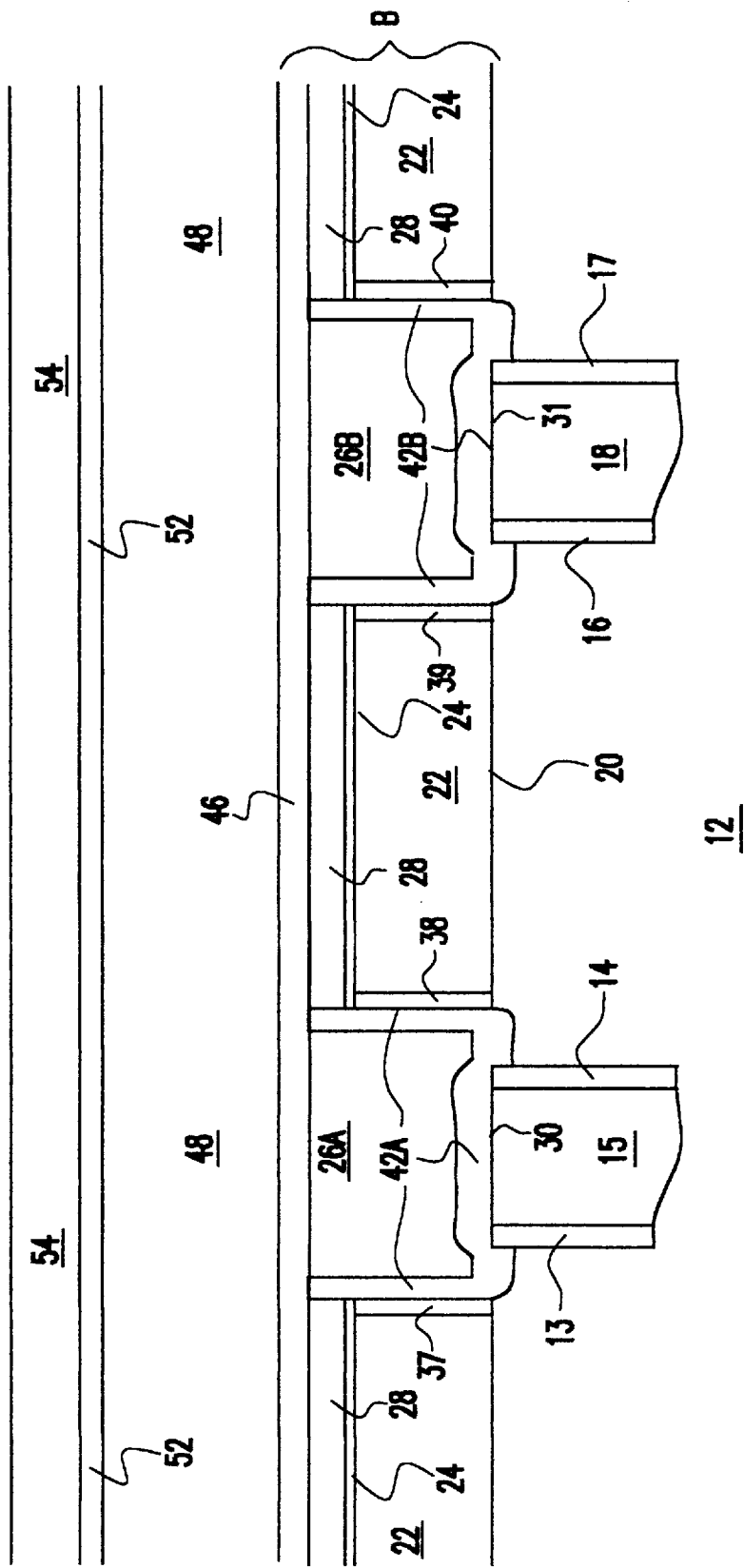
FIG. 7 is a cross-sectional view of the exemplary portion shown in FIG. 6 with three layers formed thereon according to the dual damascene process of the present invention
Figure 8:
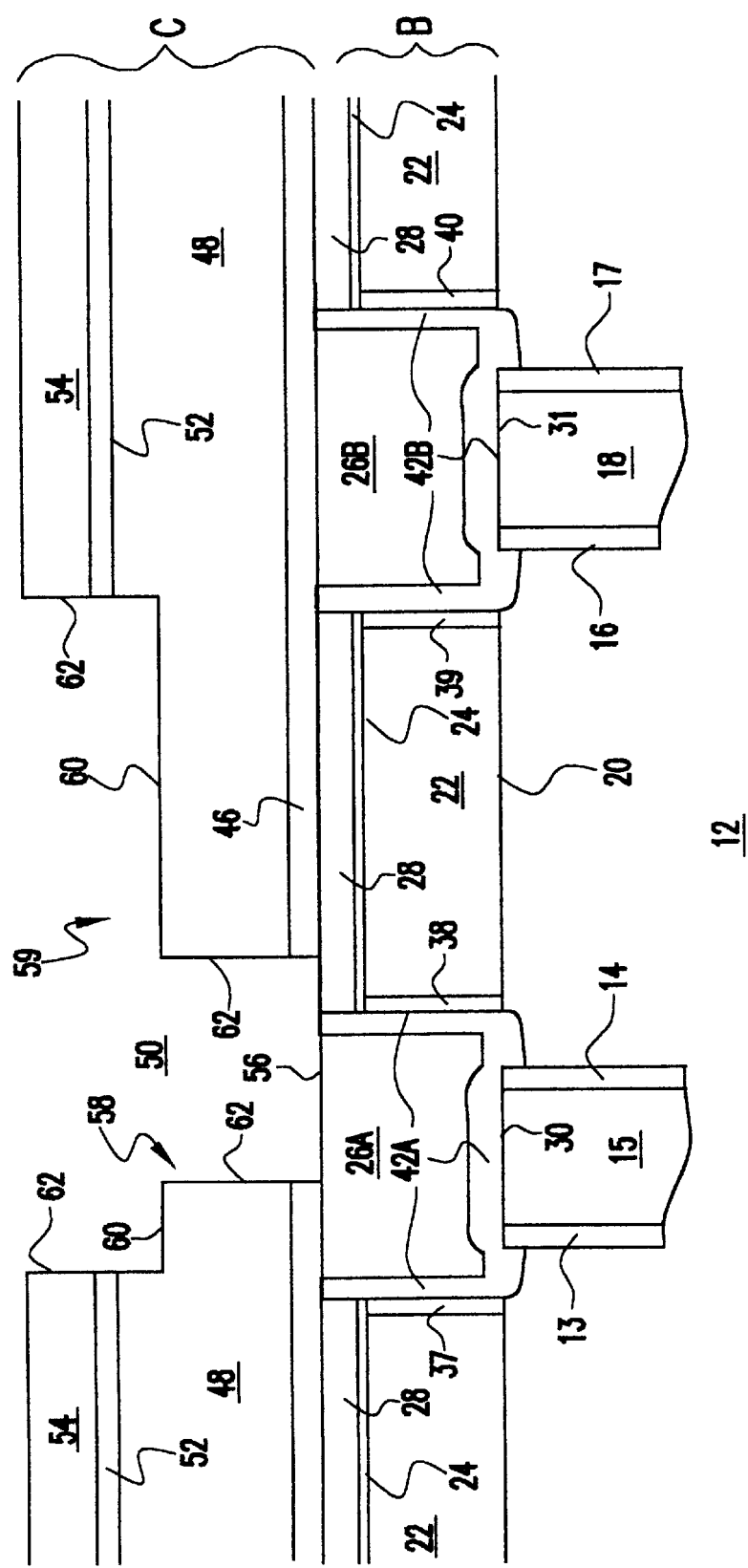
FIG. 8 is a cross-sectional view or the exemplary portion shown in FIG. 7 further showing a multifaceted trough etched in the dual damascene layer according to the present invention.

Referring now to FIG. 7, in the first steps of the second damascene process, a second FOX insulator layer 48 of dielectric material is deposited, annealed and cured. The thickness of the second FOX insulator layer 48 may vary from the thickness of the first FOX insulator layer 22. For example, a thicker second FOX insulator layer 48 of about 8500 Angstroms enables the second FOX insulator layer 48 to define a second conductor trough 50 with multifaceted contours as shown in FIG. 8. These multifaceted contours are the result of the dual damascene process.

It should be noted that instead of forming a so-called "dual damascene" layer, the second damascene layer could be formed once again with studs as previously described with respect to the first damascene layer B. It has been learned however that it is significantly less costly and more reliable to form a dual damascene layer than to form a second damascene layer over a separate layer to accommodate the formation of separate studs. Therefore, the dual damascene process is preferred.

Figure 1A:
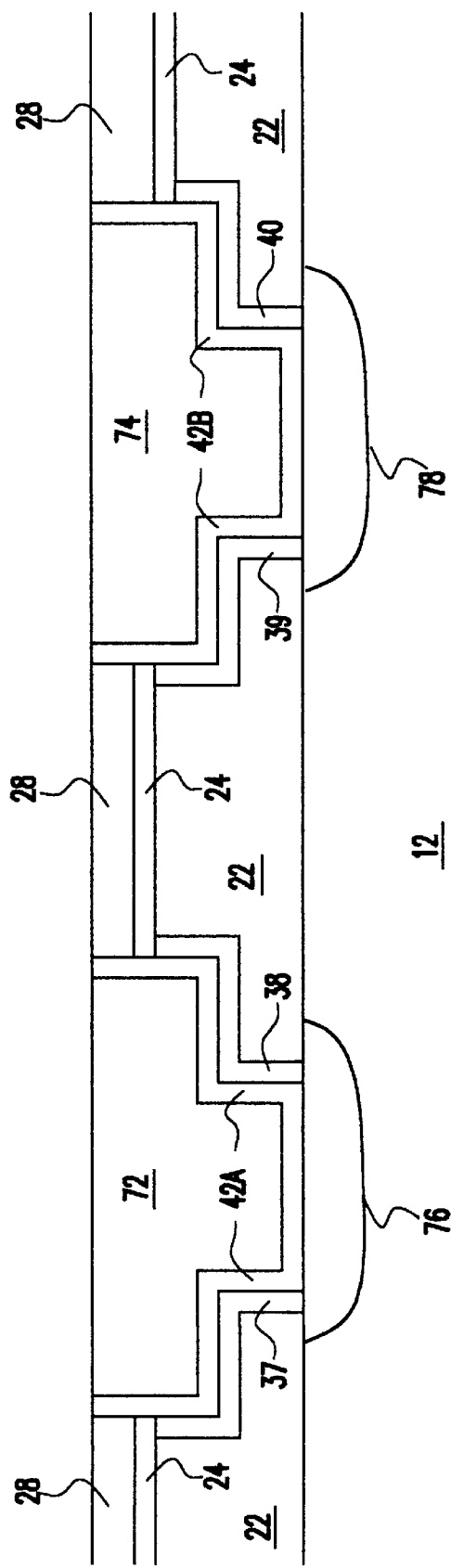
FIG. 1A is a cross-sectional view of an exemplary portion of a first damascene layer formed by a dual damascene process according to one other alternative of the present invention.

Similarly, it should be noted that the first damascene layer B may be formed as a dual damascene layer as shown in FIG. 1A. An exemplary dual damascene layer, with a pair of dual damascene troughs 72, 74, is shown. Also, the underlying electrical connections are depicted as a wells 76, 78. The wells 76, 78 are exemplary of the structure to which an electrical connection is made, such as the source or drain of a field effect transistor.

With the exception of substituting the dual damascene troughs 72, 74 for the single damascene troughs 26a, 26b shown in FIG. 1, the dual damascene layer shown in FIG. 1A is, in all other respects, alike the single damascene layer of the first damascene layer B shown in FIGS. 5 to 11. Thus, reference numbers 37–40 denote the first oxidized sidewalls, and reference numbers 42a and 42b refer to the first extrusion barriers.

Referring again to FIG. 8, the deposition of a second FOX insulator layer 48 that is thicker than the first FOX insulator layer 22 has been found to facilitate the formation of a dual damascene layer. Generally, a FOX insulator layer should be thicker for a dual damascene layer than for a single damascene layer. Thus, when the second damascene layer C is a dual damascene layer and the first damascene layer B is a single damascene layer, it is also preferred that the second FOX insulator layer 48 be thicker than the first FOX insulator layer 22.

Referring again to FIG. 7, in the next step, the second FOX insulator layer 48 is oxidized to create a second oxidized FOX layer 52. Then, a second oxide layer 54 is formed. As with the second FOX insulator layer 48, the second oxide layer 54 may be thicker to enable a thicker and/or dual damascene second conductor trough 50 as shown in FIG. 8. The nitride layer 46 will act as a stop at the end of the dual damascene etch process. Then, an additional etch will be necessary to remove the nitride layer 46 at the bottom of trench 50. During this additional etch, the second oxide layer 54 may be unmasked and exposed to the etchant. Naturally, some etching of the second oxide layer 54 will occur if it is unmasked and exposed during this additional etching process of the nitride layer 46. Thus, it is preferred to form the second oxide layer 54 thicker than the first oxide layer 28. If the method of the present invention is used to form more than two damascene layers, then these recommendations concerning the second oxide layer 54 apply to the oxide layer of the final damascene layer.

Next, referring to FIG. 8, resist is applied, exposed, and developed, then etching is performed, and this process is repeated to form the dual damascene pattern of the second conductor trough 50 by etching through the second oxide layer 54, the second oxidized FOX layer 52, and the second FOX insulator layer 48 to expose a second contact area 56 at the top of the first conductor in first conductor trough 26a.

During these etching steps, the nitride layer 46 acts as an etch stop to assist in the conclusion of the etch process step. Thus, a second etchant is used to remove the nitride layer 46 at the bottom of the second trough 50 after the resist is stripped. Although the same etchant could be used to remove the nitride layer 46 in the second conductor trough 50, it is recommended that a different etchant, more particularly suited to optimize the removal of nitride, be used.

By way of the second contact area 56, a second conductor in the second conductor trough 50 will be in electrical communication with the first conductor in the first conductor trough 26a once the method of the present invention is completed.

The process of etching defines second sidewalls 58, 59 substantially by the second FOX insulator layer 48. The second sidewalls 58, 59 are shown with horizontal portions 60 and vertical portions 62.

Collectively, the horizontal portions 60 and vertical portions 62 demonstrate that the second conductor trough 50 may have multifaceted contours. If desired for a particular embodiment of an integrated circuit chip according to the present invention, the first conductor trough 26a may also be similarly formed with multifaceted contours and of any thickness necessary to provide the desired cross-sectional shape and area. For example, the first FOX insulator layer 22 may be thicker than the second FOX insulator layer 48.

Figure 9:
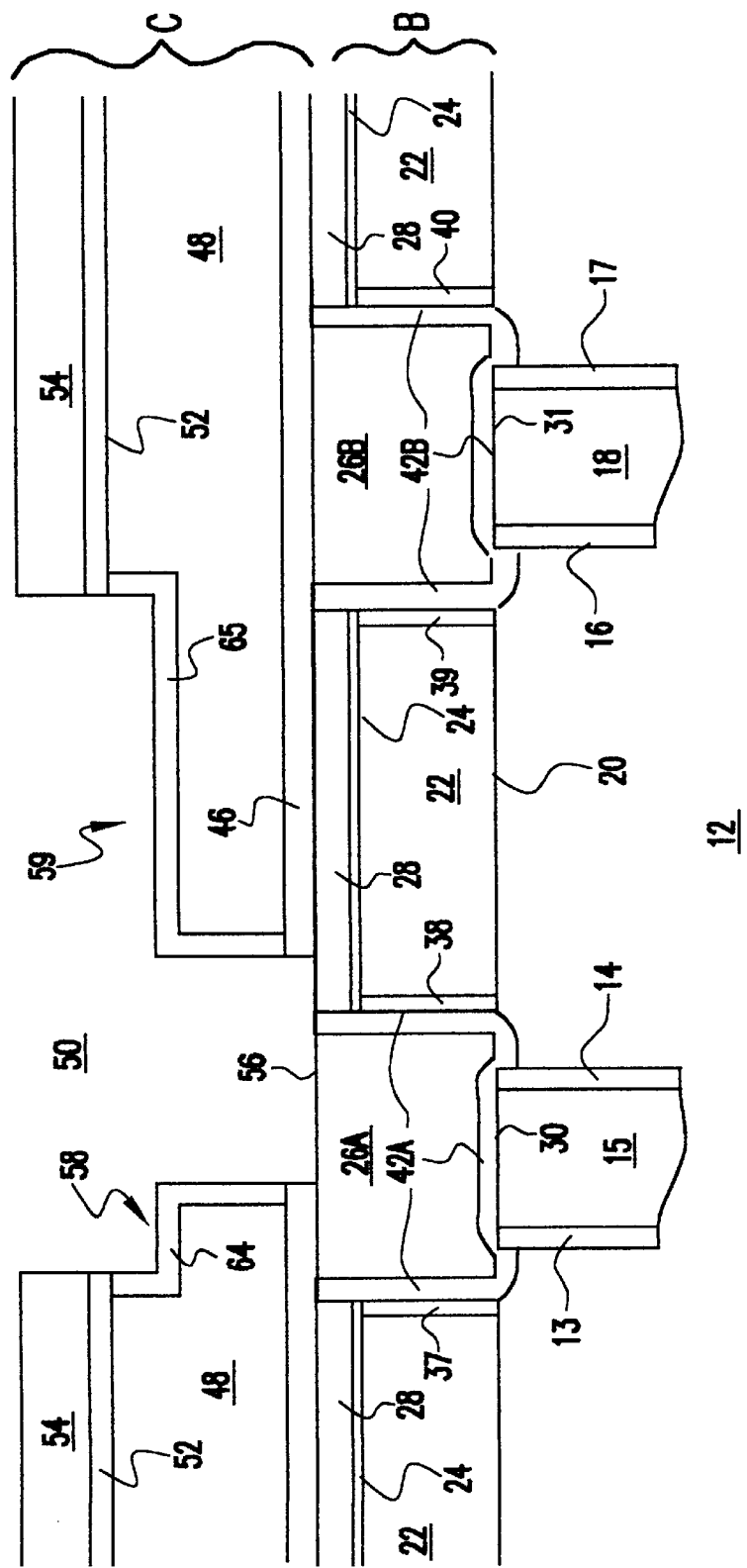
FIG. 9 is a cross-sectional view of the exemplary portion shown in FIG. 8 further showing oxidized sidewalls of the dual damascene layer according to the present invention.

Next, referring to FIG. 9, the second sidewalls 58, 59 are oxidized forming second oxidized sidewalls 64, 65. Again, a small amount of oxidation of the surfaces in the bottom of the trough 50 is removed by a directional argon sputter clean or comparable directional clean or, alternatively, a suitable omnidirectional wet clean as described in detail above. Thus, second oxidized sidewall 64 is not in contact with second oxidized sidewall 65 because the second contact area 56 is left exposed. Next, if desired, the second oxidized sidewalls 64, 65 are nitridized. This step is optional. Then, the second contact area 56 is precleaned.

Figure 10:
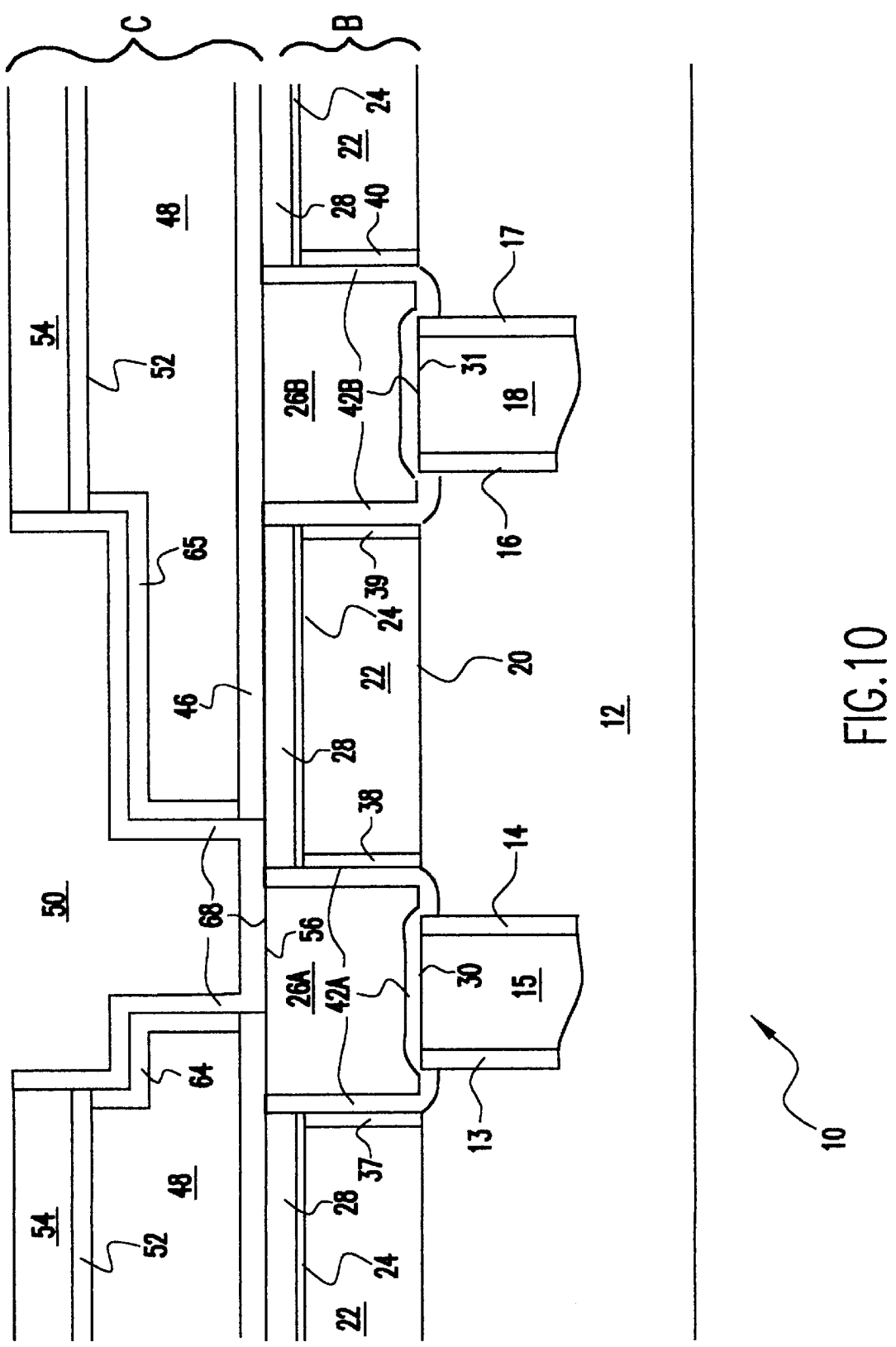
FIG. 10 is a cross-sectional view of the exemplary portion shown in FIG. 9 further showing an extrusion barrier of the dual damascene layer according to the present invention.

Afterward, referring to FIG. 10, a second extrusion barrier 68 is formed. Unlike the second oxidized sidewalls 64, 65, the second extrusion barrier 68 is a conductive, continuous, unbroken protective layer within the second conductive trough 50 covering the second contact area 56 and the second oxidized sidewalls 64, 65. Finally, as shown in FIG. 11, the second conductor is deposited and the entire surface is planarized so that a continuous planar surface 70 is formed by the top of the conductor in the second conductor trough 50 and the top of the second oxide layer 54.

In view of the foregoing, it is seen that the described invention provides a process by which robust interconnections between devices on a chip can be formed through a dual damascene process consistent with the use of a FOX dielectric material and high manufacturing yield while protecting the surfaces of the FOX from processing steps and materials that degrade the FOX during the fabrication of the semiconductor device. While doing so, the present invention also maintains as much FOX insulation as possible in the structure of the semiconductor device at all times during the fabrication of the device by providing a thin barrier through oxidizing the FOX. The present invention also provides a secondary barrier between the FOX and a metallic conductor in the device substantially impermeable to moisture and extrusion and increases the adhesion between the FOX and a material deposited on the FOX during the fabrication of the semiconductor device. This is accomplished by forming a very thin protective barrier of oxidized oxide.

While the invention has been described in terms of a single preferred embodiment, those skilled in the art will recognize that the invention can be practiced with modification within the spirit and scope of the appended claims. For example, the steps of the first damascene process repeated in the second damascene process to form the second damascene layer C may again be repeated as described above to form yet another damascene layer on top of the dual damascene structure described.

What is claimed:

1. A method of protecting a flowable oxide in a semiconductor device, said method including the steps of depositing a flowable oxide insulator layer on a substrate, said substrate having a substrate surface and a stud, said stud being electrically conductive, said flowable oxide insulator layer having a upper FOX insulator layer surface, etching said flowable oxide insulator layer to form a trough substantially defined by sidewalls of said flowable oxide insulator layer and by said substrate surface, said trough exposing said stud, forming a primary protective layer on said sidewalls of said flowable oxide insulator layer, said primary protective layer preventing the exposure of the flowable oxide insulator layer to moisture and lithographic resist developers, said primary protective layer being impervious to copper extrusion, and forming a secondary protective layer in said trough upon said primary protective layer and upon said substrate surface, said secondary protective layer being in electrical communication with said stud.

2. The method of protecting a flowable oxide as claimed in claim 1, wherein the step of etching the flowable oxide insulator layer to form a trough forms a plurality of troughs, each one of said plurality of troughs defined by said sidewalls of said flowable oxide insulator layer and by said substrate surface.

3. The method of protecting a flowable oxide as claimed in claim 1, wherein said primary protective layer is discontinuous within said trough and said secondary protective layer is continuous within said trough.

4. The method of protecting a flowable oxide as claimed in claim 1, further comprising the step of oxidizing said upper FOX insulator layer surface, thereby forming a oxidized FOX layer.

5. The method of protecting a flowable oxide as claimed in claim 4, wherein said upper FOX insulator layer surface is oxidized in an O2 plasma.

6. The method of protecting a flowable oxide as claimed in claim 4, wherein said oxidized FOX layer is less than 500 Angstroms thick.

7. The method of protecting a flowable oxide as claimed in claim 4, further comprising the step of forming a oxide layer on said oxidized FOX layer.

8. The method of protecting a flowable oxide as claimed in claim 7, wherein said oxide layer is formed by low plasma chemical vapor deposition.

9. The method of protecting a flowable oxide as claimed in claim 7, wherein said trough is formed after said oxidized FOX layer is formed and after said oxide layer is formed.

10. The method of protecting a flowable oxide as claimed in claim 9, wherein said primary protective layer is formed by oxidizing said sidewalls of said flowable oxide insulator layer.

11. The method of protecting a flowable oxide as claimed in claim 9, wherein said trough is formed by a reactive ion etch with fluorocarbon gases and said primary protective layer is formed during said reactive ion etch.

12. The method of protecting a flowable oxide as claimed in claim 9, wherein said primary protective layer is formed by the same process used to form said oxidized FOX layer.

13. The method of protecting a flowable oxide as claimed in claim 9, wherein said primary protective layer is less than 500 Angstroms thick.

14. The method of protecting a flowable oxide as claimed in claim 9, further comprising the steps of depositing a conductor in said trough and smoothing said conductor and said oxide layer thus forming an even planar surface by said conductor and said oxide layer, said conductor being in electrical communication with said secondary protective layer.

15. The method of protecting a flowable oxide as claimed in claim 14, wherein said conductor is copper.

16. The method of protecting a flowable oxide as claimed in claim 14, wherein said step of smoothing said conductor and said oxide layer is performed by polishing.

17. The method of protecting a flowable oxide as claimed in claim 14, further comprising the steps of depositing a nitride layer on said even planar surface, depositing another flowable oxide insulator layer on said nitride layer, said another flowable oxide insulator layer having another upper FOX insulator layer surface, oxidizing said another upper FOX insulator layer surface, thereby forming another oxidized FOX layer, forming another oxide layer on said another oxidized FOX layer, etching said another oxide layer, said another oxidized FOX layer, said another flowable oxide insulator layer, and said nitride layer to form another trough substantially defined by another sidewalls of said another flowable oxide insulator layer and by said even planar surface, forming another primary protective layer on said another sidewalls of said another flowable oxide insulator layer, said another primary protective layer preventing the exposure of said another flowable oxide insulator layer to moisture and lithographic resist developers, said another primary protective layer being impervious to copper extrusion, forming another secondary protective layer in said another trough upon said another primary protective layer and upon said even planar surface, said another secondary protective layer being in electrical communication with said conductor, depositing another conductor in said another trough, said another conductor being in electrical communication with said another secondary protective layer, and smoothing said another conductor and said another oxide layer thus forming another even planar surface by said another conductor and said another oxide layer.

18. The method of protecting a flowable oxide as claimed in claim 17, wherein said another oxide layer is thicker than said oxide layer.

19. The method of protecting a flowable oxide as claimed in claim 17, wherein said another flowable oxide insulator layer is thicker than said flowable oxide insulator layer.

20. The method of protecting a flowable oxide as claimed in claim 19, wherein said another trough has multifaceted contours.

21. The method of protecting a flowable oxide as claimed in claim 17, wherein said secondary protective layer and said another secondary protective layer are formed from Tantalum Nitride/Tantalum.

22. A method of protecting a flowable oxide in a semiconductor device, said method including the steps of depositing a flowable oxide insulator layer on a substrate, said substrate having a substrate surface and a stud, said stud being electrically conductive, said flowable oxide insulator layer having an upper FOX insulator layer surface, etching the flowable oxide insulator layer to form a trough defined by sidewalls of said flowable oxide insulator layer and by said substrate surface, said trough exposing said stud, forming a primary protective layer on said sidewalls of said flowable oxide insulator layer, said primary protective layer preventing the exposure of the flowable oxide insulator layer to moisture and lithographic resist developers, said primary protective layer being impervious to copper extrusion, forming a supplemental protective layer on said primary protective layer, said supplemental protective layer being impervious to moisture, lithographic resist developers, and copper extrusion, said supplemental protective layer improving adhesion with a metallic conductor, and forming a secondary protective layer in said conductive trough upon said supplemental protective layer and upon said substrate surface, said secondary protective layer being in electrical communication with said stud.

23. The method of protecting a flowable oxide as claimed in claim 22, wherein said supplemental protective layer is formed by nitridizing said primary protective layer.

24. The method of protecting a flowable oxide as claimed in claim 22, wherein said supplemental protective layer is formed by treating said primary protective layer with silicon carbide.

25. The method of protecting a flowable oxide as claimed in claim 22, wherein said supplemental protective layer is formed by treating said primary protective layer with silicon nitride.

26. The method of protecting a flowable oxide as claimed in claim 22, wherein said primary protective layer and said supplemental protective layer are discontinuous within said trough and said secondary protective layer is continuous within said trough.

* * * * *